United States Patent [19]
Ehrlich et al.

[11] Patent Number: 4,748,045
[45] Date of Patent: May 31, 1988

[54] METHOD AND APPARATUS FOR PHOTODEPOSITION OF FILMS ON SURFACES

[75] Inventors: Daniel J. Ehrlich, Lexington; Mordecai Rothschild, Newton, both of Mass.

[73] Assignee: Massachusetts Institute of Technology, Cambridge, Mass.

[21] Appl. No.: 26,062

[22] Filed: Mar. 16, 1987

Related U.S. Application Data

[63] Continuation-in-part of Ser. No. 849,710, Apr. 9, 1986, Pat. No. 4,668,528.

[51] Int. Cl.$^4$ ............................................. B05D 3/06
[52] U.S. Cl. ................................. 427/53.1; 118/50.1
[58] Field of Search .................... 427/53.1, 54.1; 118/50.1, 620

[56] References Cited

U.S. PATENT DOCUMENTS

| | | | |
|---|---|---|---|
| 3,619,288 | 11/1971 | Sirtl | 427/54.1 |
| 4,340,617 | 7/1982 | Deutsch et al. | 427/53.1 |
| 4,435,445 | 3/1984 | Allred et al. | 427/54.1 |
| 4,543,270 | 9/1985 | Oprysko et al. | 427/53.1 |
| 4,606,932 | 8/1986 | Oprysko et al. | 427/53.1 |
| 4,615,904 | 10/1986 | Ehrlich et al. | 427/38 |

FOREIGN PATENT DOCUMENTS

| | | | |
|---|---|---|---|
| 0135179 | 3/1985 | European Pat. Off. | 427/53.1 |
| 59-140368 | 8/1984 | Japan | 118/620 |
| 61-118137 | 6/1986 | Japan | 427/53.1 |

OTHER PUBLICATIONS

Leyendecker et al., "Appl. Phys. Lett.," vol. 39, No. 11, Dec. 1981, pp. 921–923.
Hanabusa et al., Appl. Phys. Lett., 35(8), pp. 626–627, (Oct. 1979).
A. Kitai et al., Materials Research Society Symposia Proceedings 17, pp. 141–147, (1983).
Swoboda et al., J. Appl. Phys., 32, 374 (1961).
L. Ben-Dor and Y. Shimony, J. Crystal Growth 24/25, 175 (1974).
S. Ibashi, et al., Magnetism and Magnetic Materials 1976, Am. Institute of Physics Conf. Proc. No. 35 (J. U. Becher, et al., eds. p. 43.
B. Kubota, J. Am. Ceram. Soc., 44, 239 (1961).

Primary Examiner—John H. Newsome
Attorney, Agent, or Firm—Hamilton, Brook, Smith & Reynolds

[57] ABSTRACT

The invention relates to visible-laser deposition reactions of metal containing oxyhalide and carbonyl vapors, such as, chromyl chloride vapor, $CrO_2Cl_2$, or cobalt carbonyl, $Co_2(CO)_8$, for direct writing of metal containing opaque patterns on various substrates ($S_i$, $S_iO_2$, GaAs and glass). Deposition at low laser power is by photolyses of adsorbed reactant molecules. Higher powers initiate deposition photochemically and continue it with a combined photolytic/pyrolytic reaction, simultaneously inducing a solid-phase conversion of the deposited film. Mixed $Cr_2O_3/CrO_2$ or cobalt thin films of 1-nanometer to several-micrometer thickness, as well as 1-millimeter-long single crystals of $Cr_2O_3$ or cobalt, can be grown with this process, the former at rates up to 3 $\mu$m/s. Thin chromium oxide films produced in this manner are strongly ferromagnetic.

21 Claims, 6 Drawing Sheets

METHOD AND APPARATUS FOR PHOTODEPOSITION OF FILMS ON SURFACES

GOVERNMENT SUPPORT

The Government has rights in this invention pursuant to Contract No. F19628-76-C-0002 and F19628-78-C-0002 awarded by the U. S. Air Force.

RELATED APPLICATION

This is a continuation-in-part of U.S. patent application Ser. No. 849,710 filed Apr. 9, 1986, now U.S. Pat. No. 4,668,528 which is incorporated herein by reference.

TECHNICAL FIELD

This invention is in the field of laser initiated photodeposition of films on surfaces.

BACKGROUND ART

Laser initiated deposition of films can be conveniently categorized as patterned or unpatterned processes wherein a laser beam imparts photon or thermal energy to reactants causing the reactants to dissociate and form a patterned or unpatterned layer on a substrate. Patterned laser depositions may be formed either by "direct writing" or projection patterning. In projection patterning an image is focused through a mask; whereas in "direct writing", a focused laser spot is translated along a substrate to form the desired pattern.

U.S. Pat. No. 4,340,617 to Deutsch et al. shows a "direct writing" laser photodeposition process for the direct generation of patterns of materials, such as metals or semiconductors, on substrates without the intermediate photolithographic steps required in conventional microelectronic fabrication. In the Deutsch et al. system, precursors, or reactants, in the gaseous phase are introduced into a reaction chamber in which a substrate is disposed. A laser beam is focused on, or adjacent to, the surface of the substrate upon which the pattern of material is to be deposited. One or more of the reactants absorbs a portion of the incident energy at a predetermined laser frequency, thereby effecting photodecomposition, or photolysis, of one or more of the reactants. For example, gaseous trimethylaluminum or dimethyl cadmium are dissociated to form aluminum or cadmium metal patterns on a substrate surface using a 257-nm laser beam.

The Deutsch et al. laser-induced deposition process is based on local-area photolytic reactions of gaseous precursors. Hanabusa et al.[(1)] describe an alternate primarily pyrolytic deposition method. This method involves local heating of the substrate with a focused laser beam.

Although more difficult in practice, substantially photolytic reactions are often preferred since they can be sustained at low temperatures and are insensitive to substrate topography, thermal conductivity, or reflectivity changes. In particular, applications on thermally fragile or transparent substrates or membranes often require such nonthermal methods.

However, because of the general inaccessibility of the dissociative transitions of most stable precursor molecules, photolytic deposition has heretofore been limited to reactions excited in the UV at wavelengths shorter than those of simple commercially available visible light emitting cw lasers. It is highly preferable to use a visible laser for many applications because of the practical simplicity and reliability of visible light emitting lasers.

A low power visible light process for depositing opaque, adherent film patterns is particularly desirable for certain applications, such as the repair of photomasks for optical lithography.

Additionally, a need exists for a photolytic deposition process capable of inducing photochemical deposition of ferromagnetic material on substrates using low power visible light. For example, chromium oxide is a ferromagnetic material extensively utilized in the fabrication of Surface Acoustic Wave (SAW) devices. Thin films of this material undergo irreversible transformation to the non-magnetic oxides of chromium during conventional high temperature deposition processing.[(2)(3)]

DISCLOSURE OF THE INVENTION

In accordance with the invention, a method and apparatus is provided for photodeposition of visible absorbing metal or metal-containing compound films on the surface of substrates located in a reaction chamber using visible light emitting sources as the energy source for initiation of the photodecomposition process. A visible absorbing metal compound is a metal compound which has the property of absorbing light in the visible spectrum. A precursor gaseous phase metal containing an oxyhalide or carbonyl compound is introduced into the chamber, typically at a subatmospheric vapor pressure, and usually entrained in an inert gas diluent. Preferably, the precursor/reactant is a gaseous compound, such as $CrO_2Cl_2$ or one of its analogues containing an opaque ferromagnetic material, for example, an oxide of chromium. Alternately, a polymetal carbonyl compound (i.e., a compound having more than one metal atom per molecule), such as $CO_2(CO)_8$ may be used. A relatively low power (i.e., 1 mw to 2 w power) beam of visible light having a wavelength of approximately 350 nm to approximately 700 nm is focused at, or near, the surface upon which the metal film is to be deposited. This light beam may be provided by a continuous wave ion laser, such as an argon-ion laser, or by a metal vapor laser. The focused laser beam initiates depositions through a substantially photolytic, non-pyrolytic dissociation of the organic material (Cl) or (CO) from the metal containing compound. This process may be through absorption in the vapor phase or in the surface-adsorbed phase, and results in the deposition of the metallic material on the substrate surface by condensation of the visible absorbing metal material molecules.

While the deposition process, described above, is a non-thermal photolytic process in the initial stages, a second pyrolytic stage may occur as the thickness of the deposited film increases. In this second stage, local heating occurs due to increased light absorption in the deposited film on the substrate. This increased absorption in turn enhances the rate of thermal elimination of undesirable reactant by-products at the substrate surface. This results in a synergistic enhancement of the rate of film growth until the film thickness is much larger than the absorption length of the deposited material.

Alternatively, if desired, this second stage can be avoided by lowering the laser power. The method and apparatus is particularly suitable for repair of photomasks or the modification or repair of circuits wherein a low cost visible light emitting laser can be employed to deposit opaque (metal) film in a desired pattern on a photomask or circuit (substrate).

BEST MODE FOR CARRYING OUT THE INVENTION

The method and apparatus of the present invention will now be described in detail in connection with the drawings. In the embodiments which follow the precursor reactant material of choice, is either vapor phase chromyl chloride, $CrO_2Cl_2$, or cobalt carbonyl, $Co_2(CO)_8$, because the deposited reaction film product is opaque and ferromagnetic chromium oxide or cobalt; both highly desirable film materials for use in a variety of applications. It is not intended, thereby, to limit the scope of applicability of this invention.

Figure 1:
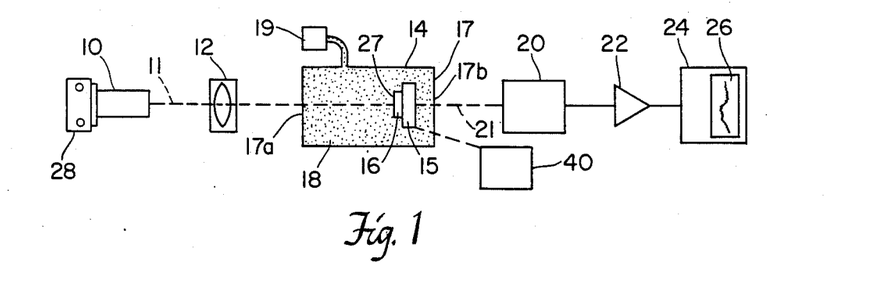
FIG. 1 is a description of the apparatus used to practice the method of the invention.

The apparatus shown in FIG. 1 is similar to FIG. 1 of the Deutsch et al. U.S. Pat. No. 4,340,617. The vapor phase chromyl chloride $CrO_2Cl_2$, or polymetal carbonyl $Co_2(CO)_8$, contained in gaseous supply assembly 19, is introduced into a reaction chamber 14. Chamber 14 has a stainless steel or quartz body 17 defining an enclosed volume. At least a portion of the body is formed of quartz or other similar material transparent to visible light.

A laser source 10, adapted to generate visible light, produces a beam 11 of energy in the visible light spectrum. The beam of energy is directed through an optical system 12 through a visible light transparent portion 17a of body 14 to a substrate body 16 disposed on jig 15.

For the metal oxyhalides, the gaseous compound 18 of $CrO_2Cl_2$ vapors within chamber 14 is photolytically decomposed by photodissociation of the $CrO_2Cl_2$ via one or two subsequent single-photon photolysis reactions, according to the following equation:

wherein the $Cl_2$ molecule is dissociated by a first photon $(hv_1)$ to produce $CrO_2Cl+Cl$ and another photon $(hv_2)$ dissociates the Cl atom from $CrO_2Cl$ to yield $CrO_2+Cl+Cl$. The $CrO_2$ condenses on the substrate forming a chromium oxide film and the Cl gas is swept away.

For the polymetal carbonyls, the gaseous compound 18 of $Co_2(CO)_8$ vapors within chamber 14 is photolytically decomposed by photodissociation of the $Co_2(CO)_8$ via repeated single-photon photolysis reactions, according to the following equation:

wherein the (CO) molecule is dissociated by a first photon $(hv_1)$ to produce $Co_2(CO)_7+CO$, and then further dissociated by photons 2–8 to finally yield $Co_2+8(CO)$. The cobalt condenses on the substrate forming a cobalt film and the carbonyl gas is swept away.

Either the laser 10, the optical system 12, or the cell or chamber 14 can be moved to effect relative movement of the focused laser beam relative to the substrate surface 27. In the illustrated embodiment of FIG. 1, a scanning system has a scanning assembly 28 secured to laser 10 for moving laser 10 in a direction normal to the optical axis of optical system 12. As the laser is moved, the focused position of the laser beam on, or adjacent to the surface 27 of substrate 16 translates and the focused position is therefore scanned across the surface of substrate 16, according to a predetermined pattern. In this manner, a line deposit can be formed or written on the surface of the substrate.

Alternatively, as shown in FIG. 1, the substrate jig 15 may be translated along the beam 11 by means of translator 40 to effectuate relative movement for patterning the substrate.

At least portions of the chamber end walls are selected to be transparent to the laser supplied energy. The substrate body 16 can be selected so that it is substantially, or at least partially, transparent to and passes the energy incident thereon. Under these circumstances, incident laser radiation can pass through chamber 14, except as attenuated, for example, by the gas, the layer deposited on substrate body 16, and the substrate body itself; and the exiting energy can be monitored by a photodetecting element 20. The photodetecting element 20, which can be inside the chamber 14 or outside as illustrated, intercepts the beam 21 exiting the chamber. The photodetecting element 20 has an electrical output signal which is received by an amplifier 22 and the amplifier 22 provides an output to a display device, such as a chart recorder 24. The illustrated recorder 24 provides a visual record 26 of the signal output from the photodetector. Thus, as the deposited layer builds up (in thickness), and the intensity of the beam intercepted by the photodetector correspondingly decreases, the record 26 provides an immediate visual record of the physical process.

The method of the invention, as heretofore described, was experimentally practiced on a variety of substrates, both transparent and non-transparent. In the experiments, the photon or laser light source was a line-tuneable 520 to 450-nm cw Ar-ion laser, which, for high-resolution deposition, was focused to a 2 micron to a 500 micron-diameter spot on various substrates in the presence of chromyl chloride or cobalt carbonyl vapors. An ArF UV excimer laser was also used to study the reaction mechanism. For transmission and mass-spectrometer studies of the reaction mechanism, a spot size of about 2 mm was used. The laser Ar-ion powers were 1 mW to several watts (i.e., power density of $10^3$ to $10^7$ watts/cm$^2$). Much higher powers, exceeding $10^3$ watts were used with the ArF laser. Transmission measurements were performed by monitoring the attenuation of the deposition beam by the deposited films with appropriate imaging optics. Mass spectrometer studies employed a cryo-pumped mass analyzer. The chromyl chloride and cobalt carbonyl were purified by distillation and used in a flowing gas stainless steel reaction chamber system. Analysis of the deposited materials was by X-ray photoelectron spectroscopy (XPS) and Auger-spectroscopic techniques.

Chromium oxide and cobalt deposits were obtained on various substrates held at room-temperature in a variety of experimental conditions, as detailed below.

EXAMPLE 1

In Example 1, lines of 5 micron width were drawn on a Si (100) substrate in a direct writing geometry wherein the substrate was scanned in the focus of an Ar-ion laser, the latter impinging at normal incidence to the substrate surface. The laser-deposited films in this example were produced at a scanning speed of 20 microns/s (dwell time 0.25 s) with a thickness of about 5 to 50-nm, depending upon the laser power. The material of the lines was bright and specular, metallic in appearance. XPS studies show these films to be mixed $Cr_2O_3$ and $CrO_2$. Auger studies indicate that the $CrO_2$ content increases at lower powers. In these experiments, excellent adherence was obtained on Si, GaAs, $SiO_2$ and glass substrates. These films were strongly attracted by a magnet, unambiguously indicating the presence of $CrO_2$, the only ferromagnetic oxide of chromium.

EXAMPLE 2

Using the same laser source, a 100 micron crystalline structure was obtained on a fused silica substrate, by translating the focusing microscope objective away from the substrate at a rate comparable to the rate of growth. Vertical growth rates of about 3 micron/s and crystal heights exceeding 1 mm were readily achieved. X-ray tests confirmed the monocrystalline nature of the grown structure. Such large single growths of compound crystal structures are only obtained in the upper range of laser powers of the experiments. The most favorable conditions for such growth appear to be at low-pressure ($<0.1$ Torr)

EXAMPLE 3

Figure 2:
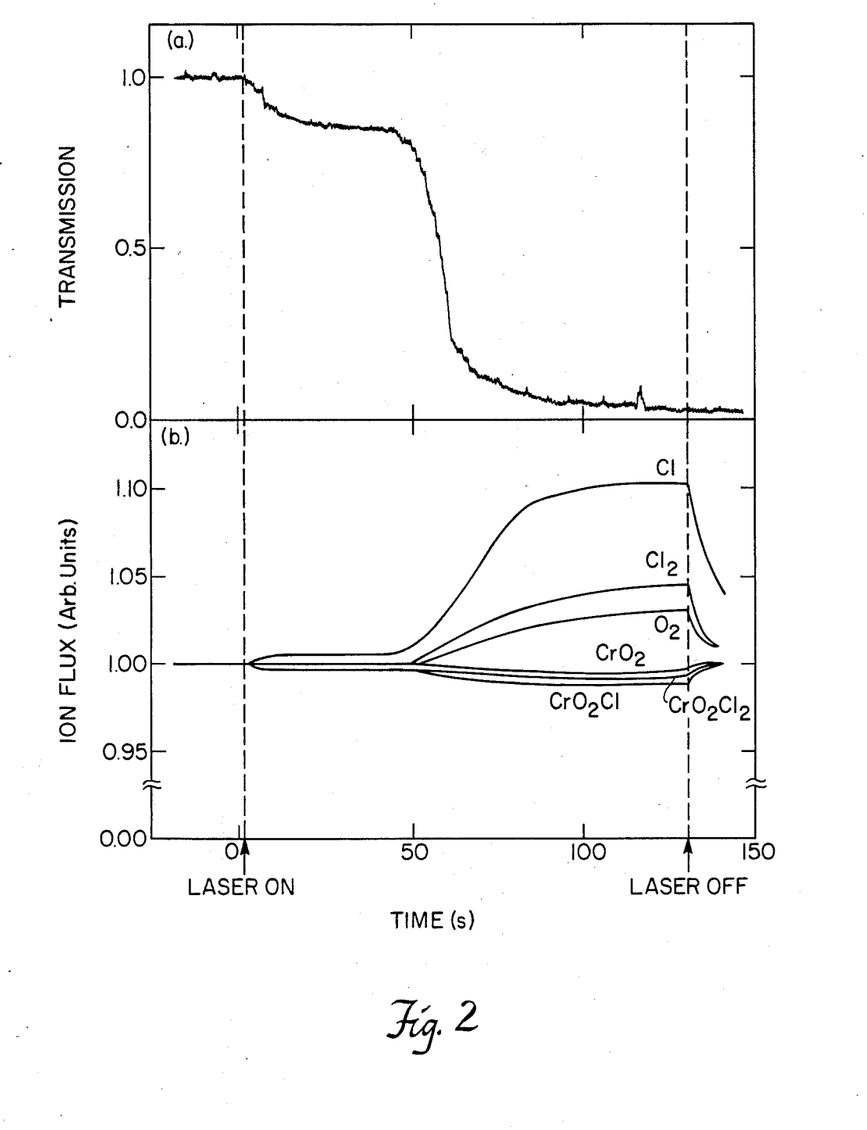
FIG. 2 is a plot of the temporal evolution of the yield and transmission characteristics of a 488-nm argon laser beam through a growing chromium oxide film being deposited on a fused silica substrate in accordance with the invention.

To investigate the surface reactions, experiments, as shown in FIG. 2, were performed by irradiation of $SiO_2$ substrates within the mass spectrometer. FIG. 2 is a plot of the temporal evolution of the mass-spectrometric yield and transmission of 488-nm argon laser beam through the growing chromium oxide thin film being deposited on a fused silica substrate. An abrupt change is observed by both measurements at t 45 s, corresponding to a transition from photolytic to pyrolytic mechanisms.

FIG. 2 reveals the existence of two distinct reaction regimes characteristic of intermediate to high laser power, namely an initial photochemical stage, followed by a pyrolytic one. In the first stage, the only detected change due to irradiation is a constant increase in the concentration of chlorine atoms generated in the $CrO_2Cl_2$ flow. A slight depression in the concentration of the parent molecule and its principal fragments (generated in the mass spectrometer ionizer) is also seen. In the same period, the transmission of the laser through the film slowly decays with time, indicating near-constant film growth. Following this stage, at about 45 s in FIG. 2, the Cl flux increases rapidly, accompanied by a rise of $Cl_2$ and $O_2$ signals as well. Simultaneously, the laser transmission drops rapidly, indicating rapid deposition.

This two-stage behavior can be interpreted as follows. First, photodissociation of gas-phase or adsorbed-phase chromyl chloride molecules takes place, via photolysis, with the resultant $CrO_2$ molecules condensing on the substrate. As the thickness of the deposited ($CrO_2$) film increases, local heating due to increasing laser adsorption in the deposited film on the (initially) transparent substrate takes place. Increased adsorption, in turn, exponentially enhances the rate of thermal Cl-, $Cl_2$-, and $O_2$-elimination surface reactions. A positive feedback mechanism is thus generated between deposited thickness and surface temperature, until the film thickness is much larger than the absorption length of the oxide. From then on, a new constant deposition rate is established, reflecting an equilibrium between decomposition and desorption of adsorbed molecules at the new, elevated temperature. The $O_2$-elimination reaction:

$$(CrO_2)_{4n\ (solid)} \xrightarrow{heat} (Cr_2O_3)_{2n\ (solid)} + nO_2(g);$$

wherein n is an integer, results in a solid state conversion to the more stable oxide, and takes place at about 400° C.[(4)], a temperature only slightly above that required for appreciable pyrolysis. Under the experimental geometry on $SiO_2$ substrates, this temperature should be achieved as soon as the film thickness is large enough for about 20 mW to be absorbed by it. This is consistent with the observation that only the initial linear photochemical phase occurs, and that no transition to the thermal phase is observed in transmission or mass spectrometer measurements at powers below about 30 mW. When the fused silica is replaced with an equally transparent sapphire substrate, the photochemical phase was observed as before, but the transition to the thermal stage (at equal laser power) occurs at about one decade larger film thicknesses or, at approximately equal thickness, but one decade higher laser power. This result is readily explained by the difference in thermal conductivity of the two substrates (about 0.34 W/cm°K. for sapphire compared to 0.014 W/cm°K. for $SiO_2$). Since the onset of heating is rapid, it is not possible to distinguish temporally the turn-on of the solid-phase conversion reaction from the turn-on of pyrolysis of gas phase molecules.

EXAMPLE 4

Figure 3:
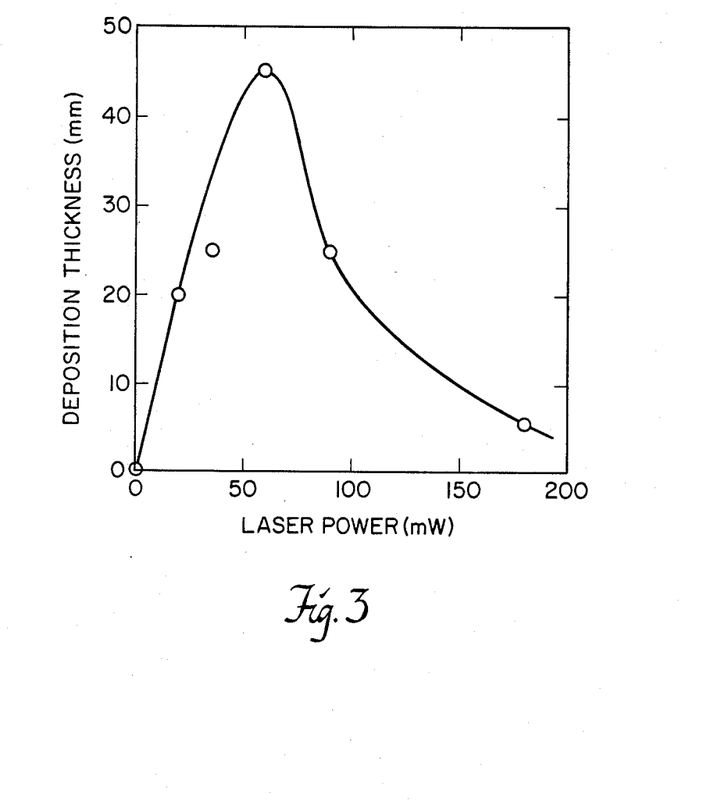
FIG. 3 represents a plot of a chromium oxide deposition thickness on Si(100) as a function of incident laser power.

In order to gain insight into the roles of gas-phase and adsorbed-phase reactions in the photochemical stage of chromium oxide deposition, a series of experiments were performed with Si substrates. Although Si absorbs in the visible, its high thermal conductivity, 1.5 W/cm°K., precludes the onset of the pyrolytic stage under our experimental conditions (7 micron spot diameter, $P \approx 0.2$ W). FIG. 3 represents the chromium oxide deposition thickness on Si(100) measured with a profilometer, as a function of incident laser power. A laser wavelength of 488-nm, chromyl chloride presence of 0.1 Torr and dwell-time of 0.35 s was employed in these experiments. The initial linear rise, followed by a rapidly reduced deposition rate (thickness), result from the two competing processes: photodecomposition of chromyl chloride, whose rate is linear with laser power; and thermally induced desorption of adsorbed molecules, at a rate which exhibits Arrhenius behavior with the laser-induced surface temperature rise. Applying a simple rate equation analysis to the data in FIG. 3, a binding energy $E_b=0.25$ eV was calculated. This value is very close to the heat of liquification of chromyl chloride, $E_L=0.21$ eV, as determined from separate vapor-pressure measurements.

Figure 4:
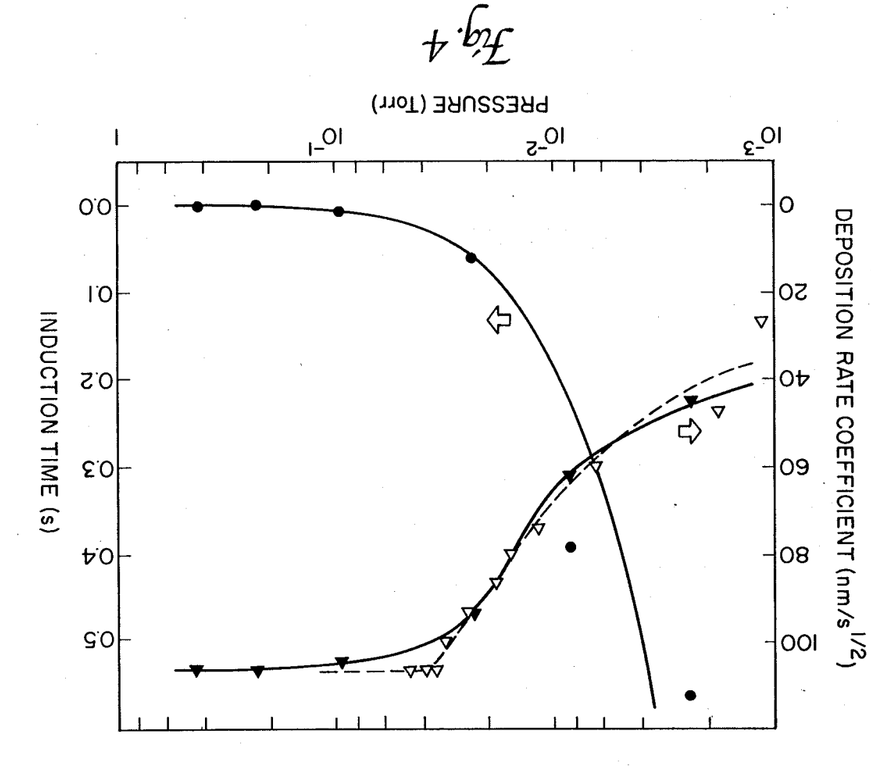
FIG. 4 is a plot of chromium oxide deposition thickness at fixed incident laser power and various chromyl chloride pressures and laser dwell-times.

While FIG. 3 demonstrates the importance of desorption, the data in FIG. 4 clarify the important role that adsorption plays in initiating the nucleation of, and promoting the growth of, the chromium oxide film. In FIG. 4, the film thickness on silicon substrates was measured with a profilometer at fixed incident power (P=18 mW), at various chromyl chloride pressures and laser dwell-times. In FIG. 4, chromium oxide deposition rate (full triangles, left hand scale) and induction time (full circles, right hand scale) as a function of chromyl chloride pressure are plotted. The data were determined from thickness vs. $t^{\frac{1}{2}}$ curves, where the dwell-time, t, was in the range of 0.35–15 s. The laser power was 18 mW at 488-nm. The open triangles (broken line) represent the adsorption isotherm of chromyl chloride, scaled so that at high pressure, the isotherm and deposition rate coincide.

At any given pressure, no deposition takes place during an induction time, $t_o$, after which the thickness grows as the square root of time. The growth rate and $t_o$ are plotted in FIG. 4 as a function of chromyl chloride pressure. This rate increases rapidly with pressure up to about 0.1 Torr and then exhibits saturation-like behavior. For comparison, the experimentally determined adsorption isotherm of chromyl chloride, measured with a quartz-crystal microbalance is also plotted in FIG. 4. The near-perfect coincidence between the deposition rate and the chromyl chloride isotherm strongly suggests that the adsorption dynamics are controlling the rate of the deposition process. The $t^{\frac{1}{2}}$ behavior of the growth rate is consistent with a deposition rate limited by mass-transport effects into the reaction zone. The induction time in FIG. 4 may reflect the time necessary for starting the film nucleation process, and appears to be inversely related to the chromyl chloride adsorbed-layer coverage.

EXAMPLE 5

In Example 5, the duration of the photochemical (photolytic) stage was studied for various pressures of cobalt carbonyl vapor and a 0.6 watt, fixed power, 488-nm argon laser beam. The duration of the photochemical stage is determined by measuring the transmission of the laser light through the film being deposited on a fused silica substrate. At first, the transmission will decrease at a gradual rate as the absorptive film is slowly deposited. At a certain moment, the transmission will more rapidly drop to near zero. This is believed to be the point at which the film has reached a thickness as to absorb enough laser light to be heated to the point of being dominated by thermal, rather than by photolytic, growth processes. The amount of time it takes for this event to occur is termed the duration of the photochemical stage.

Figure 5:
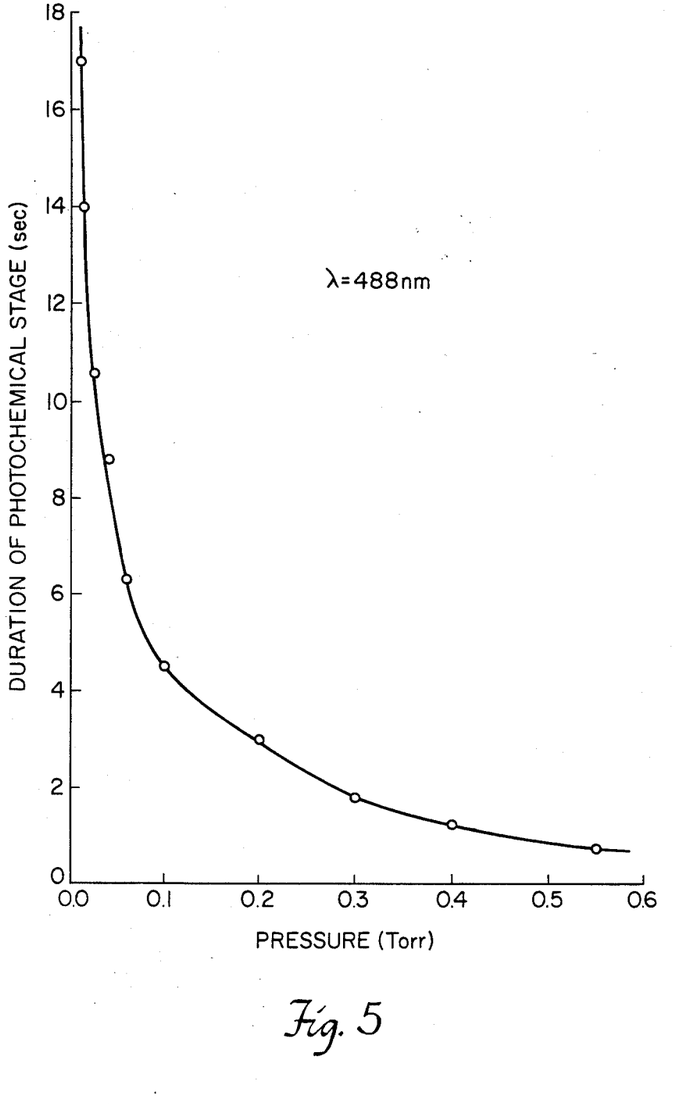
FIG. 5 is a plot of the duration of the photochemical deposition stage at fixed incident laser power and various cobalt carbonyl pressures.

As seen in FIG. 5, the duration of the photochemical stage has an inverse relationship with the pressure of the gaseous polymetal carbonyl vapor. This indicates that the higher pressures of the polymetal carbonyl vapor result in a higher deposition rate because the film thickness at which thermal effects dominate the growth rate occurs sooner.

EXAMPLE 6

Figure 6:
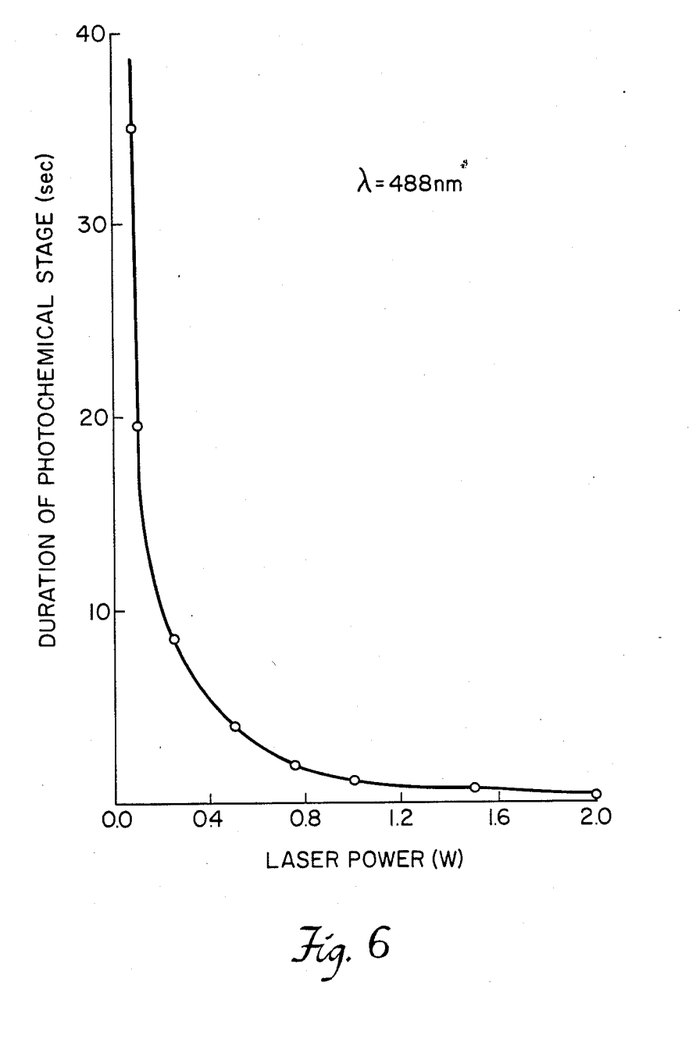
FIG. 6 is a plot of the duration of the photochemical deposition stage at fixed cobalt carbonyl pressure and various incident laser powers.

Example 6 is similar to Example 5, except that laser power, rather than polymetal carbonyl vapor pressure was varied. Thus, FIG. 6 is a plot of the duration of the photochemical stage (as defined above) against the incident laser power for a 488-nm argon laser beam. The cobalt carbonyl pressure is fixed at 0.2 Torr.

As can be seen in FIG. 6, the duration of the photochemical stage has an inverse relationship with the power of the incident 488-nm argon laser beam. This indicates that the rate of photodeposition of metals from polymetal carbonyls is directly dependent on the incident laser power.

EXAMPLE 7

In Example 7, the power dependence of the average photochemical deposition rate was determined for argon laser beams of 488-nm, 514-nm and 458-nm wavelength. The cobalt carbonyl pressure is fixed at 0.25 Torr. The average rate of photochemical deposition is defined as the ratio of absorbed light to elapsed time measured at the point that thermal, rather than photochemical, pressure of vapor effects begin to dominate the deposition process. This is a time averaged quantity, as the deposition rate is transient, even in the photochemical stage, due to film heating, changes in film reflectivity, changes in the surface composition, etc.

Figure 7:
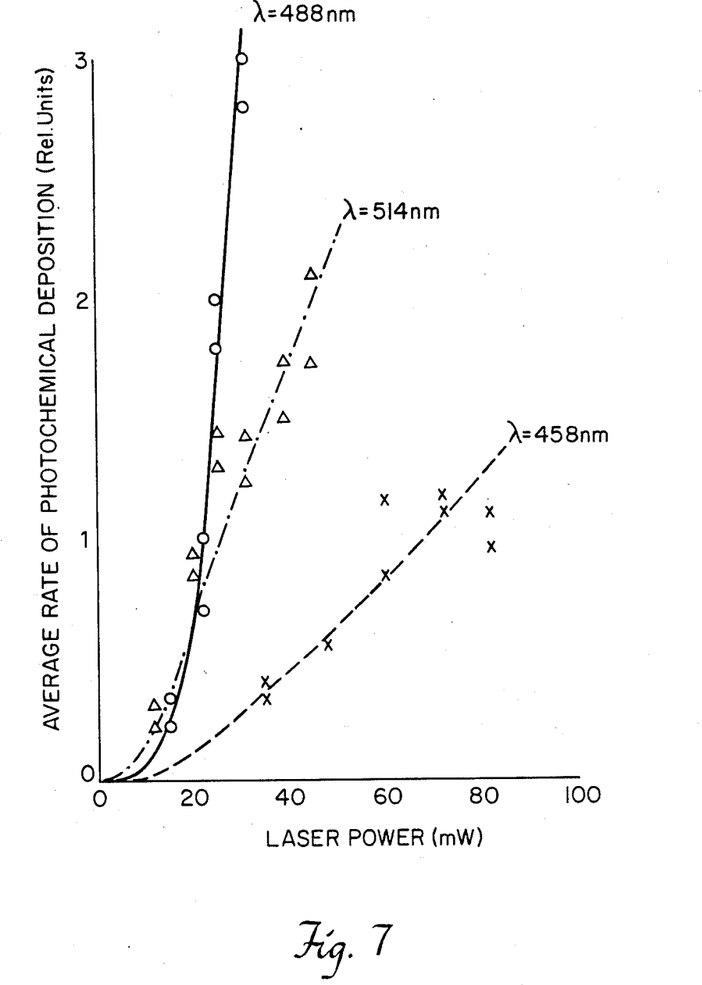
FIG. 7 is a plot of the average photochemical deposition rates at various incident laser wavelengths and powers.

As can be seen in FIG. 7, the average rate of photochemical deposition is dependent upon both wavelength of the incident laser beam, and the power of the incident laser beam.

FIG. 7 is also important in that the wavelength dependence of the photochemical deposition rate is strong evidence for the non-thermal nature of the deposition during the initial photolytic stage. This is due to the fact that the thermal effects of the three selected laser beam wavelengths are very similar to this realm. Thus, it is indicated that the average rates of photochemical deposition are dependent on the wavelength and power of the incident laser beam.

SUMMARY

Kubota's work[4] indicates that five different chromium oxide phases exist under the ambient conditions set forth above, each in their own discrete temperature bands, with little overlap between phases, over the range of 200°–400° C. Above this range, $CrO_2$ and the other oxides are irreversibly converted to the most stable form, $Cr_2O_3$. Although one may readily distinguish the photochemical from the thermal aspects of the $CrO_2Cl_2$ decomposition to chromium oxides, it appears that the production of a pure oxide of a particular stoichiometry requires either a purely photochemical reaction, or one whose thermal nature was tightly controlled. Another possibility is laser-initiation of more complex chemical reactions. We have explored the generation of a reducing ambient in order to controllably increase the Cr:O ratio. In initial studies of excimer-laser (193-nm) deposition of chromium oxide films on fused silica, the Cr:O ratio was increased from 2:3 with 0.1 Torr $CrO_2Cl_2$ to 6:5 in the presence of 200 Torr HCl.

The visible-laser direct write deposition of metal containing oxides and carbonyls, in accordance with the invention, has been developed by reactions of both the photolytic and pyrolytic type. On transparent substrates, a sharp transition from the former to the latter can be observed. These reactions are notable in that they deposit stable films with useful magnetic and/or opacity properties using visible light on both absorbing and transparent substrates.

The method and apparatus is useful for repair of defective photomasks wherein it is desirable to fill in voids in the photomask pattern with patterned opaque lines. In this case, the substrate body 16 would comprise the photomask and patterns of opaque chromium oxide or other suitable opaque metal material would be formed by translating the light beam 11 in the presence of the $CrO_2Cl_2$ or other suitable oxyhalide or carbonyl vapor.

While the principles of the invention have been described in connection with the metal-containing oxyhalide $CrO_2Cl_2$, the following equivalent precursor/reactant materials are contemplated as visible light absorbing prospects: $CrO_2F_2$, $CrO_2(NO_3)_2$, $CrO_2Br_2$, $CrO_2I_2$ and $Co(CO)_3NO$. Analogues of the above with similar electronic configurations are $MoO_2F_2$, $MoO_2Cl_2$, $WO_2F_2$, $WO_2Cl_2$, $MoOF_4$, $MoOCl_4$, $WOF_4$ and $WOCl_4$. Oxyhalides of closely related transition elements include $TaO_nF_m$, $NbO_nF_m$, $VO_nF_m$, $TaO_nCl_m$, $NaO_nCl_m$ and $VO_nCl_m$; where n and m are integers.

In addition, polymetal carbonyls other than cobalt carbonyl may be used as well. For example, other polymetal carbonyls of the formula $M_i(CO)_j$, where M denotes the metal, $i >= 1$, and $j >= 4$ may be used in the process. In particular, when $i=2$, these molecules absorb visible/near UV radiation and decompose photochemically to release the metal atoms. Some of these molecules are $Mn_2(CO)_{10}$, $Fe_2(CO)_9$, $Fe_3(CO)_{12}$, $Co_2(CO)_8$, and $Ir_4(CO)_{12}$. Furthermore, this technique would also allow the use of mixed-metal carbonyl compounds for applications in which it was desired to deposit a mixed-metal compound on the substrate. Examples include $MnRe(CO)_{10}$ and $Fe_2Os(CO)_{12}$.

Additionally, replacement of some of the carbonyl (CO) groups with nitrosyl (NO) groups is possible. The resulting visible absorbing metal nitrosyl carbonyl compounds would be, for example, $Co(CO)_3NO$ and $Fe(CO)_2(NO)_2$.

Finally, carbonyl groups could be replaced entirely by electronically similar groups, such as $PF_3$ and $PH_3$. Visible absorbing metal compounds, such as $Pt(PF_3)_4$ have been deposited on fused silica, silicon wafers and gallium arsenide wafers under conditions in which the precursor pressure is in the range of 0.1–15 Torr, the laser power varies from 0.001–10 watts and the laser wavelengths have been set at 459, 488 and 514 nm.

Equivalents

While the above described embodiments of the invention are preferred, other configuration will be apparent to those skilled in the art and thus the invention is only to be limited in scope by the language of the following claims and equivalents.

(1) Hanabusa et al., *Appl. Phys. Lett.*, 35 (8) pp 626–627, Oct. 1979.
(2) T. J. Swoboda, P. Arthur, N. L. Cox, J. N. Ingraham, A. L. Oppegard and M. S. Sadler, *J. Appl. Phys.* 32, 374 (1961).
(3) L. Ben-Dor and Y. Shimony, *J. Crystal Growth* 24/25, 175 (1974). S. Ibashi, T. Namikawa and M. Satou, *Magnetism and Magnetic Materials* 1976, Am. Institute of Physics Conf. Proc. No. 34, (J. U. Becker and G. A. Lander, eds.) p. 43.
(4) B. Kubota, *J. Am. Ceram. Soc.* 44, 239 (1961).

We claim:

1. A method for deposition of metal containing films on a surface of a substrate disposed in a reaction chamber comprising the steps of:
    (a) introducing a visible absorbing gaseous polymetal carbonyl vapor precursor into said chamber;
    (b) generating a beam of visible light directed at or near the surface upon which deposition is desired;
    (c) initiating deposition with said beam of visible light via a substantially photolytic dissociation of said precursor resulting in formation of metal containing material on said substrate surface.

2. The method of claim 1 wherein the polymetal carbonyl vapor precursor is taken from the class comprising: $Mn_2(CO)_{10}$, $Fe_2(CO)_9$, $Fe_3(CO)_{12}$, $Co_2(CO)_8$, $Ir_4(CO)_{12}$, $MnRe(CO)_{10}$, and $Fe_2Os(CO)_{12}$.

3. The method of claim 1 wherein the substrate comprises a photo-mask to be repaired or a circuit to be modified or repaired and the light is directed in a pattern to form a pattern of opaque film adherent on the substrate.

4. The method of claim 1 wherein after initiating a deposit of a metal containing film, the beam of visible light is progressively focused away from the substrate surface at a rate proportional to the film growth rate to form a substantially single crystal metal compound film on the substrate.

5. The method of claim 1 wherein the substrate is visible light transparent.

6. The method of claim 1 wherein the reaction process after initiation is primarily pyrolytic in nature.

7. The method of claim 1 wherein the precursor is $Co_2(CO)_8$.

8. The method of claim 1 wherein the precursor comprises a polymetal carbonyl wherein the metal is selected from the group consisting of Manganese (Mn), Iron (Fe), Cobalt (Co) and Iridium (Ir).

9. A method for photodeposition of cobalt film on a surface of a photomask substrate disposed in a reaction chamber comprising the steps of:
    (a) introducing gaseous $Co_2(CO)_8$ at lower vapor pressure into said chamber;
    (b) focusing a continuous wave beam of coherent, visible light at or near the surface of said substrate to initiate deposition of cobalt on said surface.

10. Apparatus for repair of photomask defects comprising:
    (a) a deposition chamber,
    (b) means for supporting said photomask in said chamber,
    (c) a continuous wave laser source of energy operating at a wavelength between about 700-nm and 350-nm,
    (d) an optical system for focusing said energy toward a portion of said photomask surface to be repaired at a position on or adjacent said surface portion, and
    (e) means for introducing a vapor of a visible absorbing metal carbonyl into said chamber adjacent to said surface, for effecting a substantially photolytic photodecomposition of the metal component of said vapor for depositing said metal component in a predetermined pattern on the photomask surface portion.

11. The apparatus of claim 10 wherein said laser is a continuous wave ion laser.

12. The apparatus of claim 10 wherein said laser is an argon-ion laser.

13. The apparatus of claim 10 wherein said laser is a metal vapor laser.

14. Apparatus for depositing a metal film on a substrate surface comprising:
   (a) a reaction chamber adapted to contain a visible absorbing gaseous polymetal carbonyl,
   (b) a substrate,
   (c) a source of continuous wave visible laser light,
   (d) means for directing a beam of said visible light at or near the substrate surface upon which a substantially photolytic deposition is desired to induce dissociation of said polymetal carbonyl resulting in formation of metallic material on said substrate surface.

15. The apparatus of claim 14 wherein the substrate is a photomask, the polymetal carbonyl is $CO_2(CO)_8$ and the metallic material is cobalt.

16. A method for deposition of metal containing films on a surface of a substrate disposed in a reaction chamber comprising the steps of:
   (a) introducing a gaseous metal oxyhalide vapor precursor into said chamber wherein the metal of the metal oxyhalide is selected from the group consisting of Tantalum (Ta), Niobium (Nb) and Vanadium (V);
   (b) generating a beam of continuous visible light directed at or near the surface upon which deposition is desired; and
   (c) initiating deposition with said beam of visible light via a substantially photolytic dissociation of said precursor, resulting in formation of metallic material on said substrate surface.

17. The method of claim 16 wherein the precursor is $VOCl_3$.

18. A method for deposition of metal containing films on a surface of a substrate disposed in a reaction chamber comprising the steps of:
   (a) introducing a gaseous metal nitrosylcarbonyl vapor precursor into said chamber;
   (b) generating a beam of continuous visible light directed at or near the surface upon which deposition is required;
   (c) initiating deposition with said beam of visible light via a substantially photolytic dissociation of said precursor resulting in formation of metal containing material on said substrate surface.

19. The method of claim 18 wherein the metal nitrosylcarbonyl vapor precursor is taken from the class comprising $Co(CO)_3NO$ and $Fe(CO)_2(NO)_2$.

20. A method for deposition of metal containing films on a surface of a substrate disposed in a reaction chamber comprising the steps of:
   (a) introducing a visible absorbing gaseous metal precursor compound containing $PF_3$ groups into said reaction chamber;
   (b) generating a continuous beam of visible light directed at or near the surface upon which deposition is required;
   (c) initiating deposition with said beam of visible light via a substantially photolytic dissociation of said precursor resulting in formation of metal containing material on said substrate surface.

21. The method of claim 20 wherein the precursor is $Pt(PF_3)_4$.

* * * * *

UNITED STATES PATENT AND TRADEMARK OFFICE
CERTIFICATE OF CORRECTION

PATENT NO. : 4,748,045
DATED : May 31, 1988
INVENTOR(S) : Daniel J. Ehrlich and Mordecai Rothschild It is certified that error appears in the above—identified patent and that said Letters Patent is hereby corrected as shown below:

Column 10, line 7, between the words "a" and "beam", insert the word ---continuous---;

Column 10, lines 15 and 41; Column 11, line 16, delete the symbol "$CO_2(CO)_8$" and insert therefor the symbol ---$Co_2(CO)_8$---;

Column 10, line 38, between the words "for" and "photodeposition", insert the words ---a substantially photolytic---;

Column 11, line 27; Column 12, line 8, delete the words "beam of continuous" and insert therefor the words ---continuous beam of---.

Signed and Sealed this

Fifteenth Day of November, 1988

Attest:

DONALD J. QUIGG

Attesting Officer

Commissioner of Patents and Trademarks